United States Patent [19]
Lerner et al.

[11] 3,766,623
[45] Oct. 23, 1973

[54] UNSOLDERING TOOL FOR PRINTED CIRCUIT BOARD USE

[75] Inventors: Julius Lerner, Broomall; Robert Mayer, Ardmore, both of Pa.

[73] Assignee: Sun Oil Company of Pennsylvania, Philadelphia, Pa.

[22] Filed: Aug. 28, 1972

[21] Appl. No.: 284,291

[52] U.S. Cl. ................ 29/203 B, 29/203 H, 29/206
[51] Int. Cl. ................................. B23p 19/00
[58] Field of Search ..................... 29/203 B, 203 H, 29/206, 206 D

[56] References Cited

UNITED STATES PATENTS 3,045,336 7/1962 Northrop et al. ................ 29/203 H

*Primary Examiner*—Thomas H. Eager
*Attorney*—Donald R. Johnson et al.

[57] ABSTRACT

A tool for unsoldering, from a printed circuit board, a component (socket, or integrated circuit) having two spaced, parallel rows of pins which are soldered to the board. The tool comprises a metallic block having a length substantially equal to that of the component being removed and having formed in one face thereof two parallel, continuous grooves of U-shaped transverse cross-section which are adapted to respectively receive the two rows of pins. The block is heated by means of a cartridge heater which extends parallel to the grooves.

10 Claims, 3 Drawing Figures

UNSOLDERING TOOL FOR PRINTED CIRCUIT BOARD USE

This invention relates to an unsoldering tool useful in connection with so-called printed circuit boards.

In using such boards, it is customary, and advantageous, to use integrated circuits (ICs). These ICs have the physical form of domino-like capsules or "chips" (within which are the solid-state, semiconductor elements forming the circuit) from which extend two parallel rows of metallic pins (by means of which electrical connections are made to the circuit elements). In some cases, these ICs are mounted directly on the printed circuit board, with the IC pins extending through individual holes in the board and being soldered to the foil on the board. In other cases, sockets are mounted on the printed circuit board, with the pins of the sockets extending through individual holes in the board and being soldered to the foil on the board; the ICs are then plugged into these sockets. In both cases, the pins which are soldered to the printed circuit board are arranged in two spaced, parallel rows. There are usually seven or eight pins in each row.

At times, the component (IC, or socket) soldered to the board goes bad, and has to be removed. It is important, in unsoldering the socket or IC, that the heat be applied at only the solder joints of the pins, and that the heat source be kept in contact with the printed circuit board only for two or three seconds. If the heat is not localized, or is applied to the board for too long a period, the board can be damaged.

Commercially-available unsoldering tools designed with the above function in mind have proven to be unsatisfactory, especially on so-called two-sided boards. In the first place, the heated body of the iron has low mass and therefore low thermal capacity. The thermal capacity is so low, in fact, that after unsoldering one component the user must either wait for the iron to heat up, or else have a group of them and use them in rotation. In the next place, they do not supply the heat fast enough, apparently because the heating element is located at the end of a handle which is at right angles to the working surface, with a relatively small cross-sectional heat conducting path between the heating element and the heated body.

An object of this invention is to provide a novel unsoldering tool for use on printed circuits boards.

Another object is to provide an unsoldering tool for IC pins or IC socket pins which will overcome the shortcomings of prior, commercially-available tools.

A further object is to provide an unsoldering tool for printed circuit board use which has high thermal capacity and which can supply heat rapidly to a printed circuit board.

The objects of this invention are accomplished, briefly, in the following manner: An elongated metallic block, having a length corresponding to that of the component to be removed, has mounted therein a cartridge-type electrical heater which extends parallel to the length dimension of the block. In one face of the block are formed two parallel, continuous grooves each of U-shaped transverse cross-section, which also extend parallel to the length dimension of the block.

A detailed description of the invention follows, taken in conjunction with the accompanying drawing, wherein.

Figure 1:
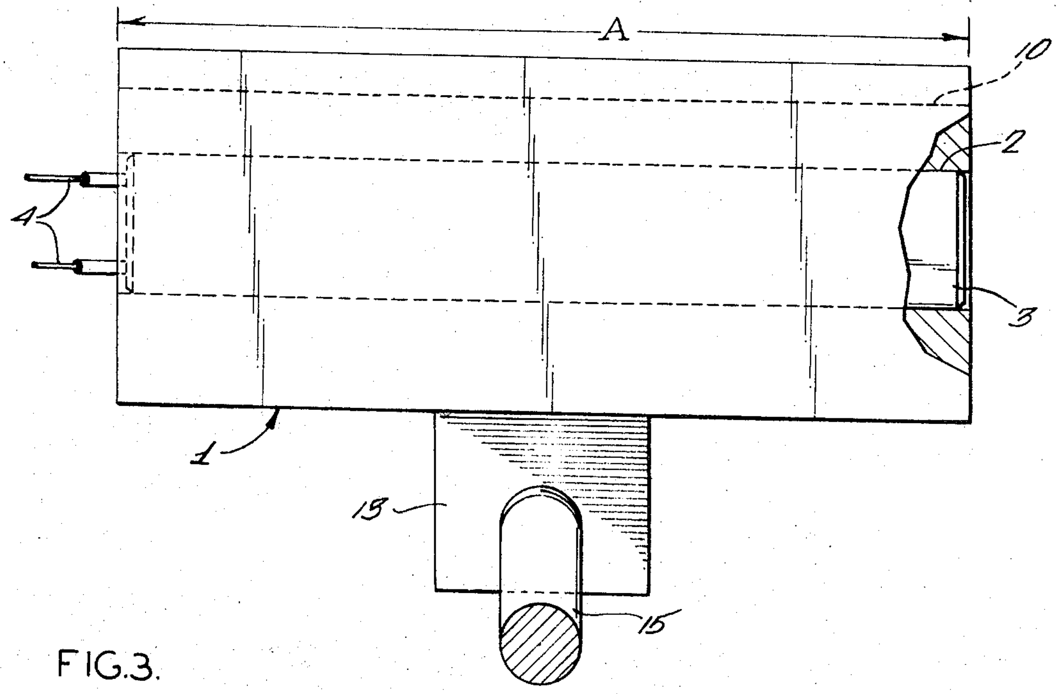
FIG. 1 is a front elevation of an unsoldering tool according to this invention.

Now referring to the drawing, the head 1 of the unsoldering tool, made of a suitable metal of high thermal conductivity, has the form of a rectangular prism, with a length A (FIG. 1) equal to the length of the component (IC or IC socket) being removed (by unsoldering) from a printed circuit board. By way of example, the length of an IC capsule or housing may be 1⅜ inches, the overall lengths of the rows of pins (or socket pins) electrically connecting the IC to the printed circuit board (and which are to be unsoldered using the tool of this invention) being about the same as this, or slightly less. The head or block 1 has therein a cylindrical bore 2, which extends entirely through the block in the direction of its length A, the axis of this bore thus being parallel to this length dimension. An electrical cartridge-type (cylindrical) heater 3 is fixedly mounted in bore 2, the heater 3 having leads 4 which are connected to a rheostat (not shown) used to control the electric power supplied to the heater. Heater 3, supplied from a source of electrical energy, serves to heat the block or mass 1 to a temperature suitable for melting solder.

Figures 2, 3:
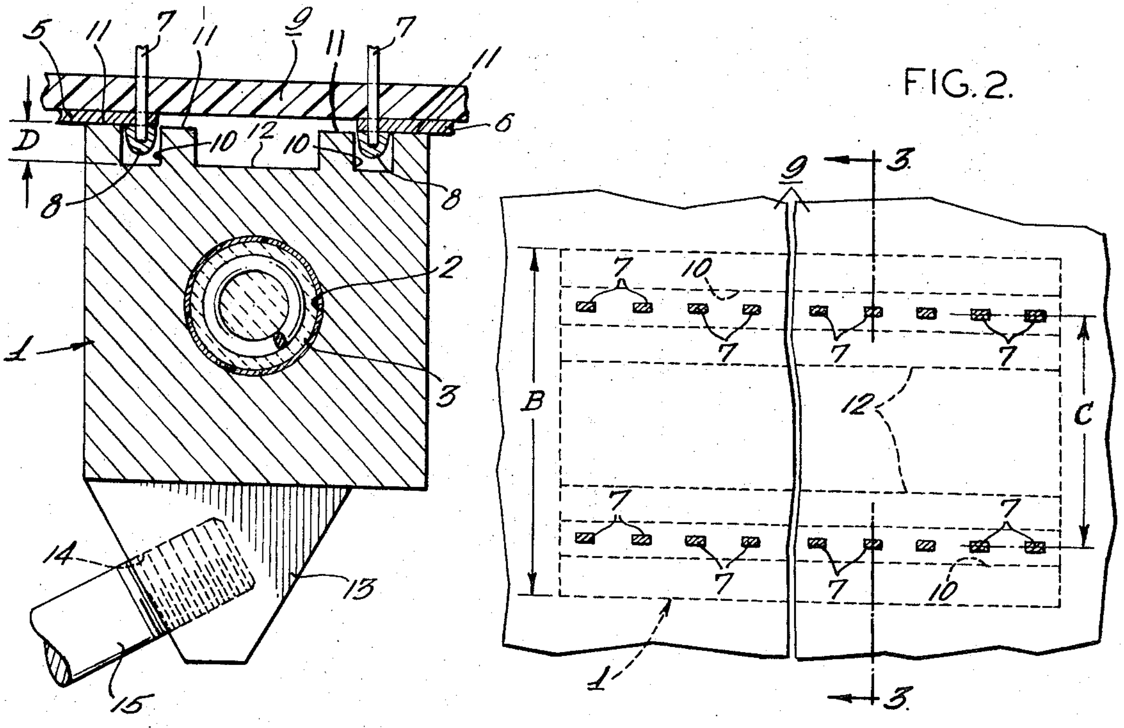
FIG. 2 is a fragmentary plan view of the tool of this invention, as used for unsoldering on the foil side of a printed circuit board.
FIG. 3 is a cross-section taken along line 3—3 of FIG. 2.

Refer now more particularly to FIGS. 2 and 3. ICs, and IC sockets, are conventionally mounted on a printed circuit board 9 of electrical insulating material, and are electrically connected to metallic foils such as 5 and 6 provided on one or both sides of the board 9, means of two spaced, parallel rows of conducting pins 7 which extend through respective, individual holes in board 9 and which are soldered as at 8 (FIG. 3) to their respective foils such as 5 or 6. By way of example, there may be fourteen pins 7 in each of the two rows, the two rows being spaced a (known) distance of nineteen thirty-secondths inch apart, the adjacent pins in each row being three thirty-secondths inch apart. The capsule or housing of the IC may be eleven-sixteenths inch wide, with pins such as 7 extending along its two longer sides.

The width B of the head 1 (which is the horizontal dimension in FIG. 3) is made just large enough to span the outside of the two rows of pin solder joints 8.

On its upper or working face, the head 1 has a pair of spaced, parallel grooves 10 which are substantially U-shaped in transverse cross-section and which run the entire length A of the head. Each of the two grooves 10 is continuous, and each is open at its two ends. The center-to-center distance C of the grooves 10 is made equal to the center-to-center distance between the two rows of pins 7, that is, to the known spacing between the two rows of pins. The grooves 10 are just wide enought to permit the solder joints 8 around the pins 7 to fit (see FIG. 3). The lands 11 are the minimum (width) to apply heat and contain the solder; a typical dimension is about one-sixteenth inch.

Between the two lands 11 (the widths of which were set forth previously), the upper or working face of head 1 has a relatively wide central groove 12 which, like groove 10, is substantially U-shaped in transverse cross-section and which runs the entire length A of the head. The purpose of this central groove 12 is to prevent heating of sections of the printed circuit board 9 other than the pin area.

The grooves 10 and 12 are cut to a depth D of about one-sixteenth inch.

On its bottom face (i.e., the face opposite to the working or grooved face), the head 1 has an integral frusto-pyramidal boss 13 which is usually, but not necessarily, located at the central portion of the length of this head or block. The boss 13 has therein a tapped hole 14 which provides for mounting the heating head 1 on a handle 15 (as illustrated in FIG. 3), or for mounting the heating head on a bench-mounted stand.

In use, the heated head 1 is applied to the foil side of the printed circuit board 9 as shown in FIG. 3, with the grooves 10 fitted over the solder joints 8 around the pins. (It is pointed out that the thicknesses of the foils 5 and 6 are greatly exaggerated in FIG. 3.) Then, when the solder 8 around the pins has melted sufficiently, the pins 7 in both rows may be withdrawn upwardly out of the board 9, from the upper or component side thereof.

The invention claimed is:

1. An unsoldering tool for unsoldering from a printed circuit board a plurality of spaced pins disposed in a row of known length, comprising a metallic body of a length substantially equal to said known length, means forming in one face of said body a groove extending parallel to the length dimension of said body and having a length coextensive with said length dimension, said groove being sized to accommodate therein the ends of said pins and the solder joints thereat; and an elongated electrical heating means mounted in said body and extending parallel to the length dimension thereof.

2. Tool according to claim 1, including also means in said body providing for the attachment of a heat-insulating supporting means thereto.

3. Tool of claim 1, wherein said heating means comprises a cartridge-type electrical heater mounted in a bore formed in said body.

4. Tool according to claim 1, including also means forming in said one face of said body a second groove extending parallel to the length dimension of said body and having a length coextensive with said length dimension, said second groove being sized to accommodate therein the ends of a plurality of spaced pins disposed in a second row, and the solder joints thereat.

5. Structure of claim 4, wherein the length of said second row is known and is the same as the length of the first-mentioned row.

6. Structure of claim 4, wherein the spacing between the second and first-mentioned body grooves equal to the the known spacing between the second and first-mentioned rows of pins.

7. Structure of claim 4, wherein the heating means comprises a cartridge-type electrical heater mounted in a bore formed in said body.

8. Structure set forth in claim 4, including also means in said body providing for the attachment of a heat-insulating supporting means thereto.

9. Structure set forth in claim 4, including also means forming in said one face of said body a third groove extending parallel to the length dimension of said body and having a length coextensive with said length dimension, said third groove being located between and separating said second and first-mentioned grooves.

10. Structure of claim 9, wherein the cross-section of said third groove is larger than that of either of said second and said first-mentioned grooves, thereby to prevent the application of heat by said body to areas of said board other than the areas of said pins and of said solder joints.

* * * * *